United States Patent
Joo et al.

(10) Patent No.: US 9,510,445 B2
(45) Date of Patent: Nov. 29, 2016

(54) MEMBER FOR FLEXIBLE ELEMENT AND MANUFACTURING METHOD THEREOF

(71) Applicants: SNU R&DB FOUNDATION, Seoul (KR); KOREA INSTITUTE OF SCIENCE AND TECHNOLOGY, Seoul (KR)

(72) Inventors: Young Chang Joo, Seoul (KR); In Suk Choi, Seoul (KR); Myoung Woon Moon, Seoul (KR); Byoung Joon Kim, Seoul (KR); Min Suk Jung, Incheon (KR)

(73) Assignees: SNU R&DB FOUNDATION, Seoul (KR); KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 252 days.

(21) Appl. No.: 14/360,836

(22) PCT Filed: Nov. 26, 2012

(86) PCT No.: PCT/KR2012/010055
§ 371 (c)(1),
(2) Date: May 27, 2014

(87) PCT Pub. No.: WO2013/081347
PCT Pub. Date: Jun. 6, 2013

(65) Prior Publication Data
US 2014/0338961 A1    Nov. 20, 2014

(30) Foreign Application Priority Data

Nov. 28, 2011  (KR) .................. 10-2011-0125364
Oct. 24, 2012  (KR) .................. 10-2012-0118694

(51) Int. Cl.
*B05D 5/00*   (2006.01)
*H05K 1/09*   (2006.01)
*H05K 3/14*   (2006.01)

(52) U.S. Cl.
CPC ................. *H05K 1/09* (2013.01); *H05K 3/146* (2013.01); *H05K 2201/0154* (2013.01); *H05K 2201/0969* (2013.01)

(58) Field of Classification Search
USPC ............................................. 977/2
See application file for complete search history.

(56) References Cited

U.S. PATENT DOCUMENTS

2003/0010971 A1*  1/2003  Zhang ................... B82Y 10/00
                                                                              257/15

(Continued)

FOREIGN PATENT DOCUMENTS

| JP | 2008-163397 A | 7/2008 |
| KR | 20100132369 A | 12/2010 |
| KR | 20110094261 A | 8/2011 |

OTHER PUBLICATIONS

International Search Report mailed Feb. 27, 2013; PCT/KR2012/010055.

*Primary Examiner* — Steven T Sawyer
(74) *Attorney, Agent, or Firm* — Ladas & Parry LLP

(57) ABSTRACT

In the present invention, a copper electrode having a nanohole structure is prepared by using a polymer substrate in the form of nanopillars in order to avoid fatigue fracture that causes degradation of electrical and mechanical properties of a flexible electrode during repetitive bending of a typical metal electrode. The nanohole structure may annihilate dislocations to suppress the initiation of fracture and may blunt crack tips to delay the propagation of damage. Therefore, the nanohole electrode exhibits very small changes in electrical resistance during a bending fatigue test.

15 Claims, 20 Drawing Sheets

(56) References Cited

U.S. PATENT DOCUMENTS

| | | | |
|---|---|---|---|
| 2008/0212102 A1* | 9/2008 | Nuzzo | G01N 21/554 356/445 |
| 2009/0131245 A1* | 5/2009 | Esconjauregui | B01J 23/75 502/100 |
| 2011/0166045 A1* | 7/2011 | Dhawan | B82Y 10/00 506/39 |
| 2012/0325669 A1* | 12/2012 | Kim | C07K 14/31 205/109 |
| 2013/0295325 A1* | 11/2013 | Shah | G01N 21/554 428/138 |

* cited by examiner

MEMBER FOR FLEXIBLE ELEMENT AND MANUFACTURING METHOD THEREOF

TECHNICAL FIELD

The present invention relates to a member for a flexible device and a method of manufacturing the same, and more particularly, to a member for a flexible device having a metal electrode and a method of manufacturing the same.

BACKGROUND ART

Recently, products, such as paper handphones, flexible displays, and flexible batteries, have been developed as a technique of integrating a flexible device on a flexible substrate has advanced. However, more technological development may be required for real industrialization of the above products. The biggest limitation for the industrialization is to ensure reliability when mechanical deformation, such as bending, tension, compression, and torsion, is applied during the operation of a flexible device. With respect to an actual electronic device, a metal electrode has been more frequently used in real industry due to high electrical conductivity, low cost, and ease of processing in comparison to a material such as graphene and conductive oxide. Recently, in order to increase a degree of mechanical deformation of metal electrodes and wirings, wiring structures in a wavy shape, an arc shape, and a horseshoe shape have been suggested. These structures may increase the degree of deformation by using an extra deformation structure that decreases local instability of the metal electrode. These structures may allow a deformation of 50% or more. However, an actual fracture of a flexible device may occur under deformation conditions in which a strain is lower than a fracture strain but it is repetitive. Stability of the metal electrode with respect to fatigue facture is a very important issue. Actually, with respect to a bendable or foldable mobile phone, a cyclic deformation of 1 million times or more must be ensured. Thus, the stability of the metal electrode in a flexible device must be resolved for mass production.

Fatigue fracture is a fracture mode in which a facture of a material occurs under a condition of a repetitive load. The fatigue facture behavior of a metal thin film may be broadly divided into two categories, i.e., crack formation and crack propagation. The crack formation is related to the movement of dislocations during repetitive deformation. Since the movement of the dislocations may form protrusions such as extrusions or intrusions, stress may be locally concentrated. Eventually, crack formation may occur. After the formation of cracks, propagation of cracks, which increase the resistance of the metal electrode, may follow. Therefore, a technique capable of controlling the formation and propagation of cracks may be needed. However, research into a method of improving electrical and mechanical reliabilities of the metal electrode under high cycle conditions is insignificant.

DISCLOSURE OF THE INVENTION

Technical Problem

The present invention provides a new concept of a metal electrode having a nanostructure for increasing fatigue resistance. However, objects of the present invention are exemplarily provided, and the scope of the present invention is not limited by these objects.

Technical Solution

According to an aspect of the present invention, there is provided a member for a flexible device including: a substrate; and a metal electrode which is formed on the substrate and includes at least one or more nanoholes.

In the member for a flexible device, the substrate may include a substrate on which at least one or more nanopillars is formed, and the nanopillars may penetrate through the nanoholes.

In the member for a flexible device, the nanopillars may extend upward from a top surface of the substrate while being formed in one piece with the substrate.

In the member for a flexible device, the metal electrode may be a plate-shaped metal electrode that is formed on an entire surface of the substrate.

In the member for a flexible device, the nanopillar may be spaced apart from a sidewall of the nanohole.

In the member for a flexible device, the substrate and the nanopillar may be formed by including polyimide, and the metal electrode may be formed by including copper.

In the member for a flexible device, the at least one or more nanopillars may include the plurality of nanopillars, and the at least one or more nanoholes may include the plurality of nanoholes.

In the member for a flexible device, each of the plurality of nanopillars may penetrate through each of the plurality of nanoholes.

In the member for a flexible device, the metal electrode may include a metal that is composed of a plurality of grains, and at least one grain of the plurality of grains may include the at least one or more nanoholes.

In the member for a flexible device, the metal electrode may include a metal that is composed of a plurality of grains, and the at least one or more nanoholes may be formed between the plurality of grains.

In the member for a flexible device, the metal electrode may include a metal that is composed of a plurality of grains, and an average diameter of the gains may correspond to an average spacing between the nanoholes adjacent to each other.

In the member for a flexible device, the metal electrode may include a metal that is composed of a plurality of grains, and an average diameter of the gains may correspond to an average spacing between the nanopillars adjacent to each other.

In the member for a flexible device, an average thickness and an average height of the nanopillars and an average spacing between the nanopillars adjacent to each other may be a few tens to a few hundreds of nanometers.

According to another aspect of the present invention, there is provided a method of manufacturing a member for a flexible device including: providing a substrate; and forming a metal electrode including at least one or more nanoholes on the substrate.

In the method of manufacturing a member for a flexible device, the providing of the substrate may include providing the substrate on which at least one or more nanopillars is formed; and the forming of the metal electrode including at least one or more nanoholes on the substrate may include forming a metal electrode including at least one or more nanoholes, through which the nanopillar penetrates, on the substrate.

In the method of manufacturing a member for a flexible device, the providing of the substrate on which at least one or more nanopillars is formed may include: preparing a substrate having a flat top surface; and forming the at least one or more nanopillars by etching a portion of an upper part of the substrate having a flat top surface.

In the method of manufacturing a member for a flexible device, the forming of the metal electrode including at least one or more nanoholes, through which the nanopillar penetrates, on the substrate may include depositing a metal on the substrate by a thermal evaporation process.

In the method of manufacturing a member for a flexible device, the thermal evaporation process may be performed under a condition in which overhangs of the metal are formed at upper ends of the nanopillars.

In the method of manufacturing a member for a flexible device, the method may further include removing a portion of the nanopillars protruding from a top surface of the metal electrode, after the forming of the metal electrode including at least one or more nanoholes, through which the nanopillar penetrates, on the substrate.

In the method of manufacturing a member for a flexible device, the providing of the substrate on which at least one or more nanopillars is formed may include: preparing a substrate having a flat top surface; and growing the at least one or more nanopillars on the substrate having a flat top surface.

Advantageous Effects

According to an embodiment of the present invention, the nanohole structure of a metal electrode may prevent electrical or mechanical destruction during repetitive bending of a metal thin film. Since the nanohole structure of the metal electrode may act as an absorption layer decreasing the occurrence of stress to suppress the formation of cracks by plastic deformation and blunt crack tips, the nanohole structure may delay crack propagation. In addition, a copper electrode including nanoholes may be bent in any direction and may withstand both tensile and compressive stresses. The nanohole-structured copper electrode may rapidly increase electrical reliability and may form a metal electrode without fatigue fracture. The nanohole metal electrode exhibited a change in electrical resistance of 10% or less after 500,000 bending cycles. In contrast, a typical meal electrode having the same thickness exhibited an increase in electrical resistance of 300% or more. However, the scope of the present invention is not limited to these effects.

BRIEF DESCRIPTION OF THE DRAWINGS

FIG. 4a is a cross-sectional view illustrating a cross section of the member for a flexible device, according to the embodiment of the present invention, which is cut along line I-I of FIG. 3a;

FIG. 6b is a result of a bending fatigue evaluation which is measured on the member for a flexible device according to the embodiment of the present invention using the system of FIG. 6a;

MODE FOR CARRYING OUT THE INVENTION

Figure 1A:
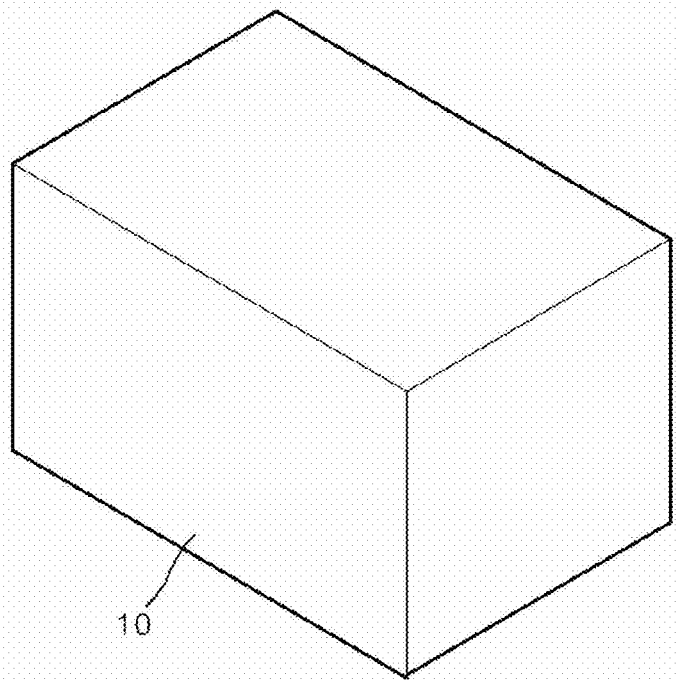
FIGS. 1a to 1c are a perspective view or field emission scanning electron microscope (FE-SEM) images illustrating a polyimide substrate before forming nanopillars in a method of manufacturing a member for a flexible device according to an embodiment of the present invention.

Hereinafter, the present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Also, sizes of elements in the drawings may be exaggerated for convenience of explanation.

This application claims priority to Korean Patent Application No. 10-2011-0125364, filed on Nov. 28, 2011, and Korean Patent Application No. 10-2012-0118694, filed on Oct. 24, 2012, in the Korean Intellectual Property Office, the disclosures of which are incorporated herein in their entirety by reference.

Figure 1B:
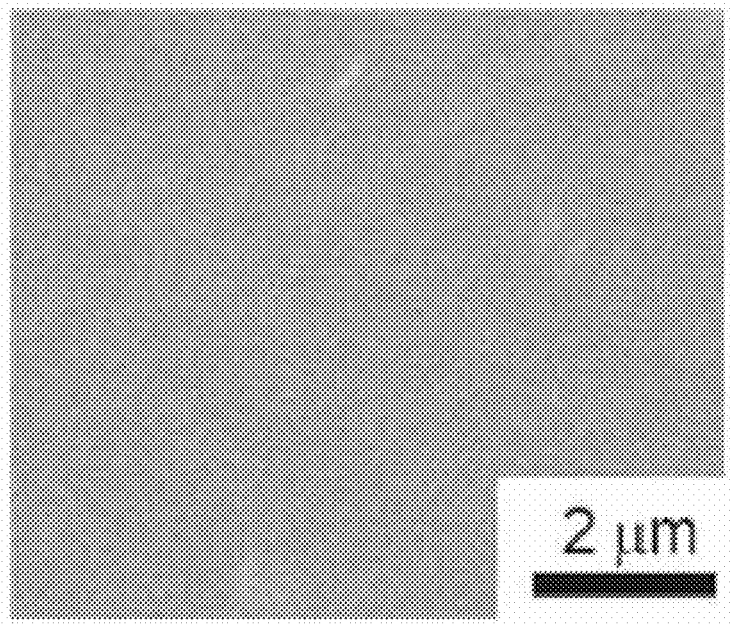
Figure 1C:
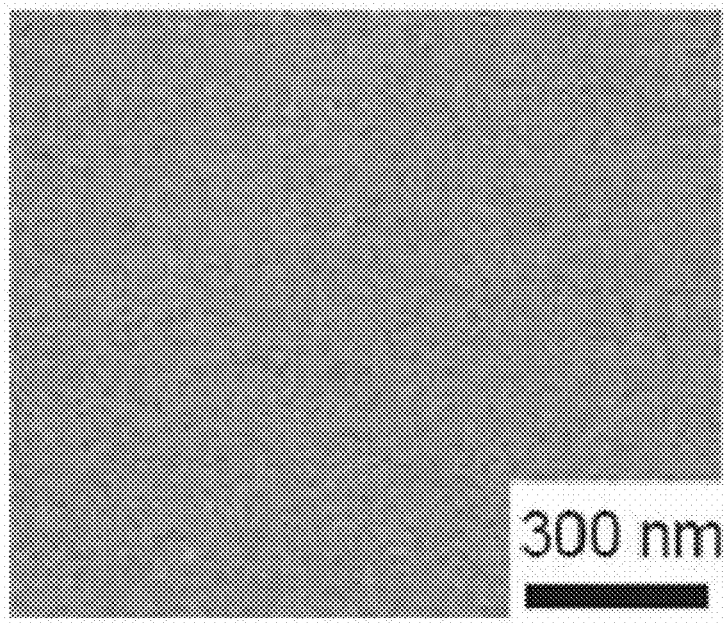

FIGS. 1a to 1c are a perspective view or field emission scanning electron microscope (FE-SEM) images illustrating a polyimide substrate before forming nanopillars in a method of manufacturing a member for a flexible device according to an embodiment of the present invention.

Referring to FIGS. 1a to 1c, a substrate 10 is first prepared. The substrate 10 is a flexible substrate that is applicable to flexible devices such as paper cell phones, flexible displays, and flexible batteries, and for example, may include a polyimide substrate. The substrate 10 may be a substrate that has a flat top surface. In an experimental example for realizing a member for a flexible device according to an embodiment of the present invention, a 125 µm thick polyimide (Kapton, DuPont) substrate was used.

Figure 2A:
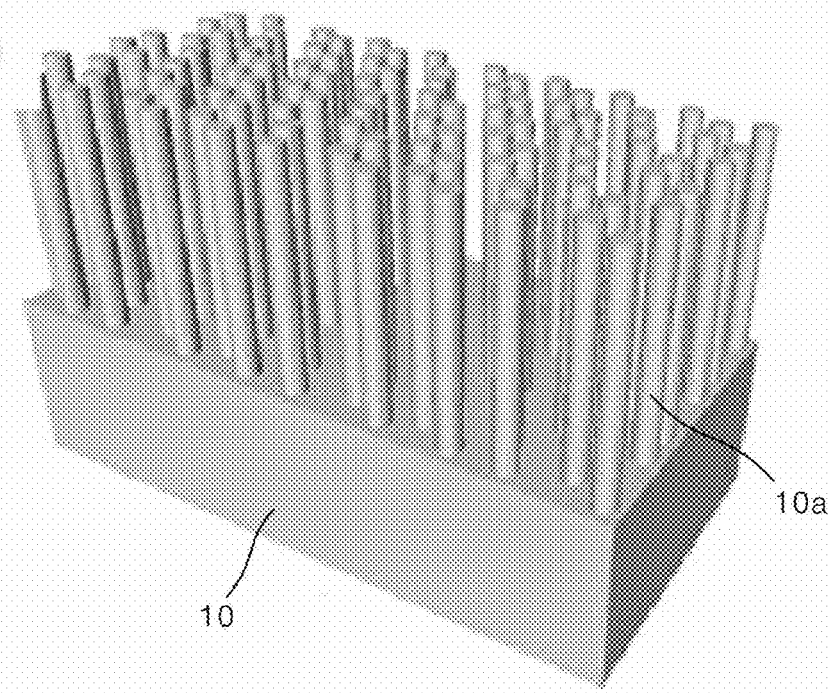
FIGS. 2a to 2c are a perspective view or FE-SEM images illustrating a polyimide substrate having nanopillars formed thereon in the method of manufacturing a member for a flexible device according to the embodiment of the present invention.
Figure 2B:
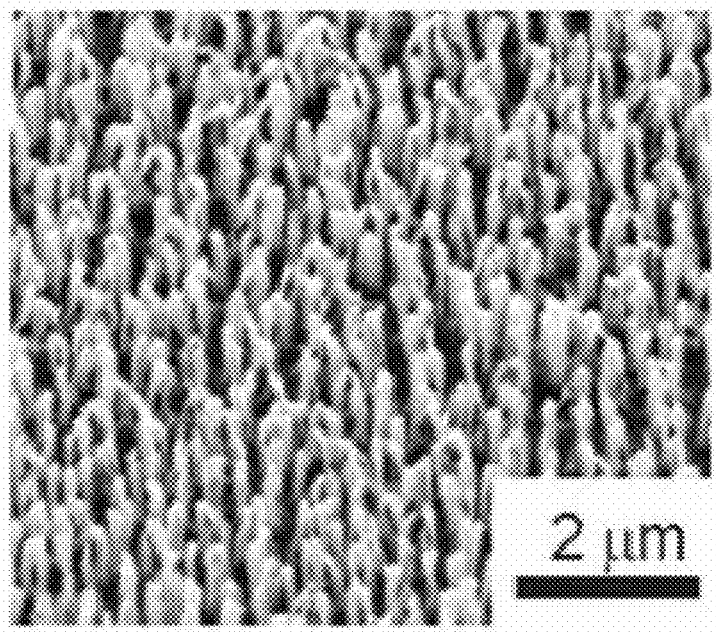
Figure 2C:
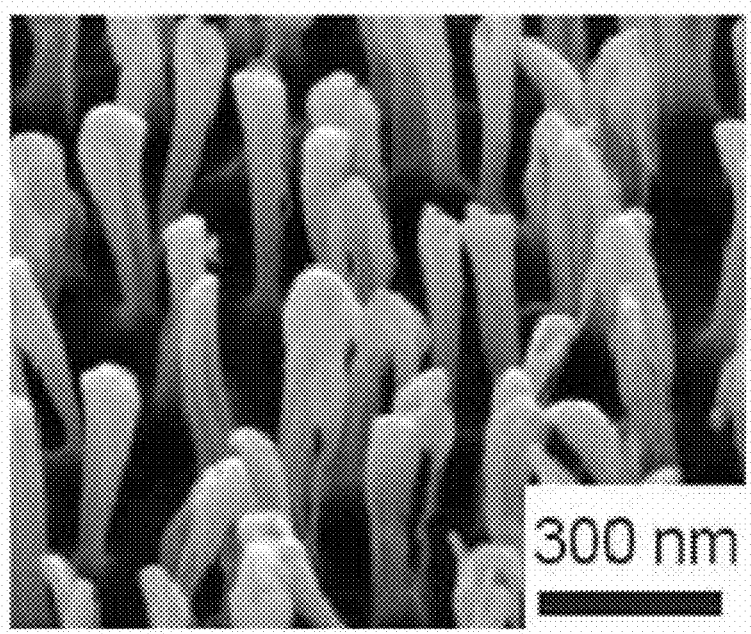

FIGS. 2a to 2c are a perspective view or FE-SEM images illustrating a polyimide substrate having nanopillars formed thereon in the method of manufacturing a member for a flexible device according to the embodiment of the present invention. All the images were obtained under a condition of being tilted 40 degrees.

Referring to FIGS. 2a to 2c, at least one nanopillar 10a is formed by etching a portion (e.g., a portion extending downward from a top surface) of an upper part of the substrate 10 that has a flat top surface. For example, nano-sized pillars were formed on the polyimide substrate 10 by $CF_4$ plasma etching using a method similar to plasma-assisted chemical vapor deposition (PACVD). In the experimental example of the present invention, a gas pressure of the etching process was $3 \times 10^{-2}$ Torr, an applied voltage was −500 V, and an etching time was 60 minutes.

The nanopillars 10a, which are realized by etching the portion of the upper part of the substrate 10, are formed integrally with the substrate 10 and are formed in a direction extending upward from the exposed top surface of the substrate 10. Here, the direction along which the nanopillars extend upward from the exposed top surface of the substrate 10 includes a direction perpendicular to the substrate 10. Furthermore, the direction along which the nanopillars extend upward from the exposed top surface of the substrate 10 may include a direction away from the exposed top surface of the substrate 10 even though the direction is not perpendicular to the top surface of the substrate 10 but is inclined thereto. The nanopillars 10a may be uniformly formed on the entire exposed surface of the substrate 10. At least one nanopillars 10a may include a plurality of nanopillars 10a. The average thickness and average height of the nanopillars 10a and the average spacing between the nanopillars 10a adjacent to each other may be a few tens to hundreds of nanometers. In the experimental example of the present invention, the average thickness, the average height, and the average spacing were 100 nm, 800 nm, and 100 nm, respectively.

In the embodiment of the present invention, it was illustrated that the nanopillars 10a are formed by etching a portion of the top surface of the substrate 10. However, the present invention is not limited thereto. For example, the nanopillars 10a may be realized by being selectively grown on the top surface of the substrate 10. Particularly, a catalyst including at least one element selected from the group consisting of iron (Fe), nickel (Ni), cobalt (Co) and palladium (Pd) may be formed on the top surface of the substrate 10 and glow discharge is performed by supplying reaction gas. Then, the reaction gas that is ionized by the glow discharge is provided to the catalyst and the nanopillars 10a may be realized by growing nanotubes or nanowires.

Figure 3A:
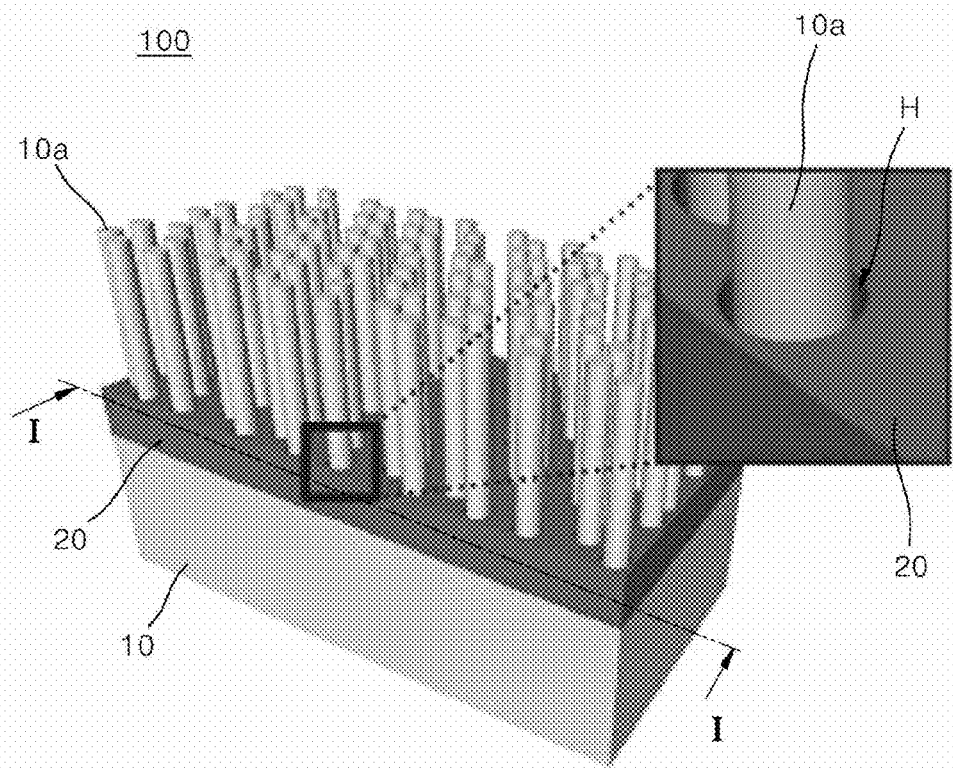
FIGS. 3a to 3c are a perspective view or FE-SEM images illustrating a member for a flexible device, in which a copper electrode including nanoholes is formed on a polyimide substrate having nanopillars formed thereon, according to an embodiment of the present invention.
Figure 3B:
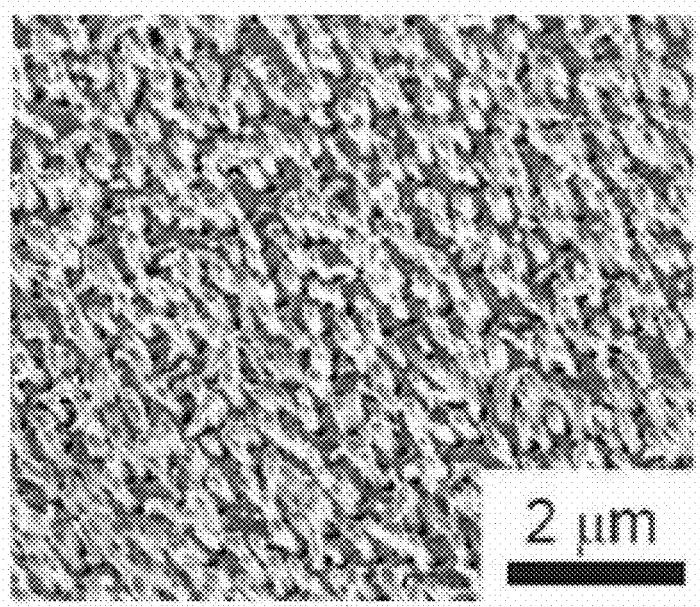
Figure 3C:
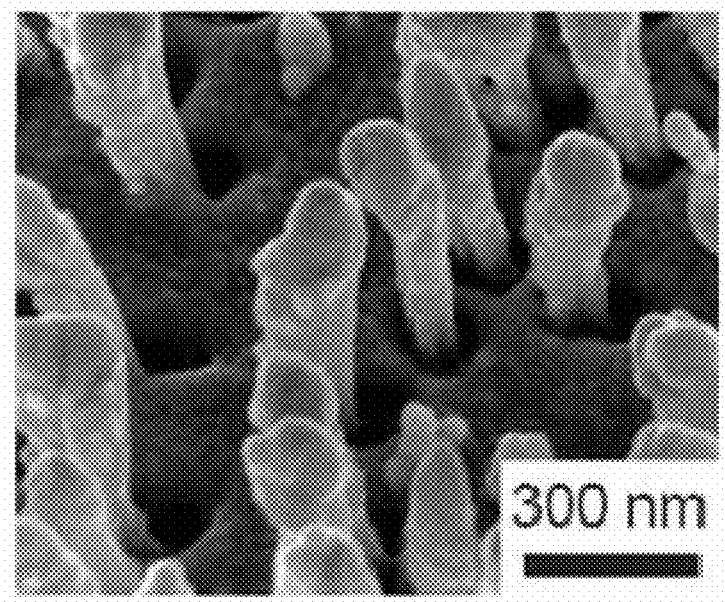

FIGS. 3a to 3c are a perspective view or FE-SEM images illustrating a member for a flexible device, in which a copper electrode including nanoholes is formed on a polyimide substrate having nanopillars formed thereon, according to an embodiment of the present invention. All the images are obtained under a condition of being tilted 40 degrees.

Referring to FIGS. 3a to 3c, a metal electrode 20 that includes at least one nanohole H is formed on the substrate 10 on which the nanopillars 10a are formed. The metal electrode 20 may include a plate-shaped metal electrode that is formed on the entire surface of the substrate 10. The metal electrode 20, for example, may be a copper electrode. The nanopillars 10a that are formed on the substrate 10 are configured to penetrate through the at least one nanohole H. For example, when at least one nanohole H includes a plurality of nanoholes H and at least one nanopillar 10a includes a plurality of nanopillars 10a, each of the plurality of nanopillars 10a may be configured to penetrate through each of the plurality of nanoholes H. Another example would be that at least one nanopillar 10a may be configured to penetrate through at least one nanohole H.

The nanopillar 10a may be spaced apart from a sidewall of the nanohole H. For example, the nanopillars 10a may be spaced apart from the sidewalls of the nanoholes H, without contacting any of the sidewalls. Another example would be that the nanopillars 10a may be disposed spaced apart from at least part of the sidewalls of the nanoholes H, without contacting the at least part of the sidewalls.

The metal electrode 20 that includes the nanoholes H may be realized by depositing a metal on the substrate 10 that has the nanopillars 10a formed thereon, by thermal evaporation process. In the experimental example of the present invention, copper was deposited by thermal evaporation on the substrate 10 on which the polyimide nanopillars 10a are formed. In the deposition process, a pressure was maintained at $5 \times 10^{-6}$ Torr, a deposition rate was 24 nm/min, and a thickness of the copper thin film was 200 nm. A nanohole H structure was formed on the metal electrode 20 that is composed of a copper thin film, due to a screening effect caused by the nanopillars 10a during the deposition of the metal.

The configuration of the member for a flexible device according to the embodiment of the present invention will be described in more detail with reference to FIG. 4a, which is a cross-sectional view taken along line I-I of FIG. 3a and illustrates a cross section of the member for a flexible device according to the embodiment of the present invention.

Figure 4A:
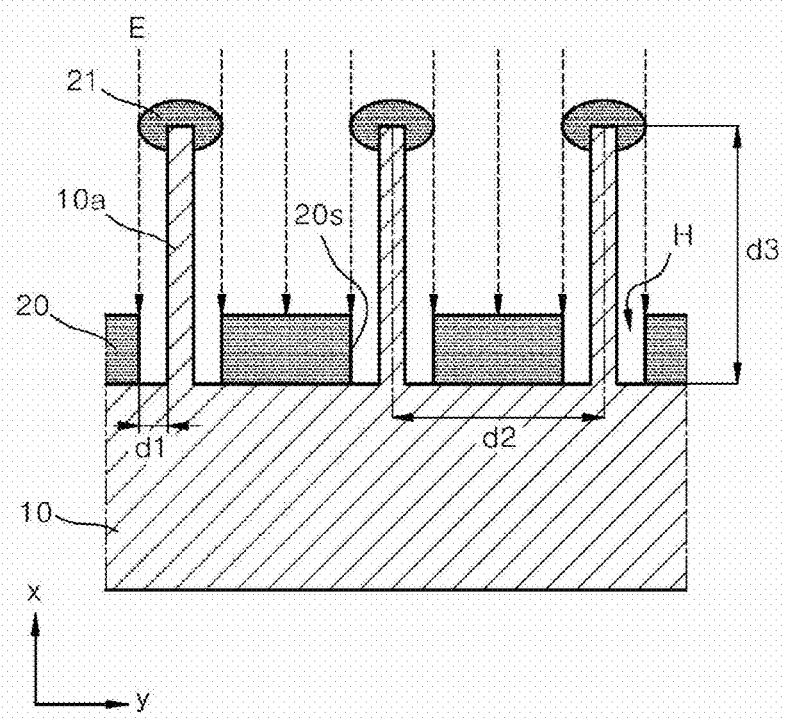

Referring to FIG. 4a, the metal electrode 20 that includes at least one nanohole H is formed on the substrate 10 that includes at least one nanopillar 10a. As described above, metal, such as copper, is deposited by thermal evaporation on the substrate 10 that includes the nanopillars 10a. The deposition of the metal that constitutes the metal electrode 20 may be realized when a source E of the metal to be deposited, e.g., a gas-phase metal or a metal precursor, reaches the top surface of the substrate 10 within an empty space between the adjacent nanopillars 10a.

A phenomenon, in which the nanopillars 10a obstruct the progression of the source E of the metal to be deposited during the deposition of the metal, may occur as a height d3 of the nanopillars 10a is large and a spacing d2 between the adjacent nanopillars 10a is small. This phenomenon is more noticeable when the source E of the metal to be deposited is obliquely incident on the top surface of the substrate 10. Because of this screening phenomenon by the nanopillars 10, areas around the nanopilars are not deposited with the metal, but the nanoholes H may be generated. Furthermore, overhangs 21 of the metal may appear at upper ends of the nanopillars 10a in the thermal evaporation process of the metal. These overhangs 21 may obstruct the arrival of the source E of the metal to be deposited around the nanopillars 10a, and thus, the metal may not be deposited around the nanopillars 10a, but the nanoholes H may occur. The nanoholes H may be formed around the nanopillars 10a due to the screening phenomenon or overhangs caused by the nanopillars 10a, and a sidewall 20s of the nanohole H and the nanopillar 10a may have a predetermined spacing d1 therebetween.

Figure 4B:
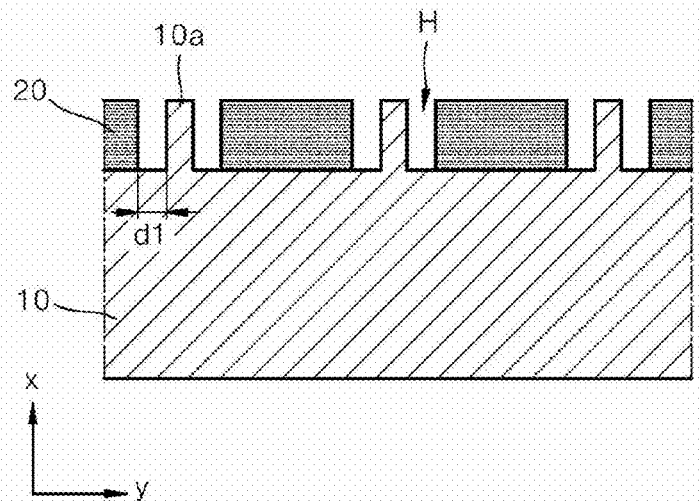
FIG. 4b is a cross-sectional view illustrating a cross section of a member for a flexible device according to another embodiment of the present invention.

FIG. 4b is a cross-sectional view illustrating a cross section of a member for a flexible device according to another embodiment of the present invention.

Referring to FIG. 4b, in the member for a flexible device according to another embodiment of the present invention, nanopillars 10a penetrate through nanoholes H but do not protrude beyond a top surface of a metal electrode 20. This structure may be formed by removing the nanopillars 10a that protrudes beyond the top surface of the metal electrode 20 in the member for a flexible device illustrated in FIG. 4a, and for example, may be realized by mechanical polishing, chemical polishing, or chemical mechanical polishing. Since the member for a flexible device according to another embodiment of the present invention does not have a structure protruding beyond the top surface of the metal electrode 20 that includes the nanoholes H, an additional subsequent process (e.g., deposition of a thin film) on the metal electrode 20 can be carried out.

Figure 4C:
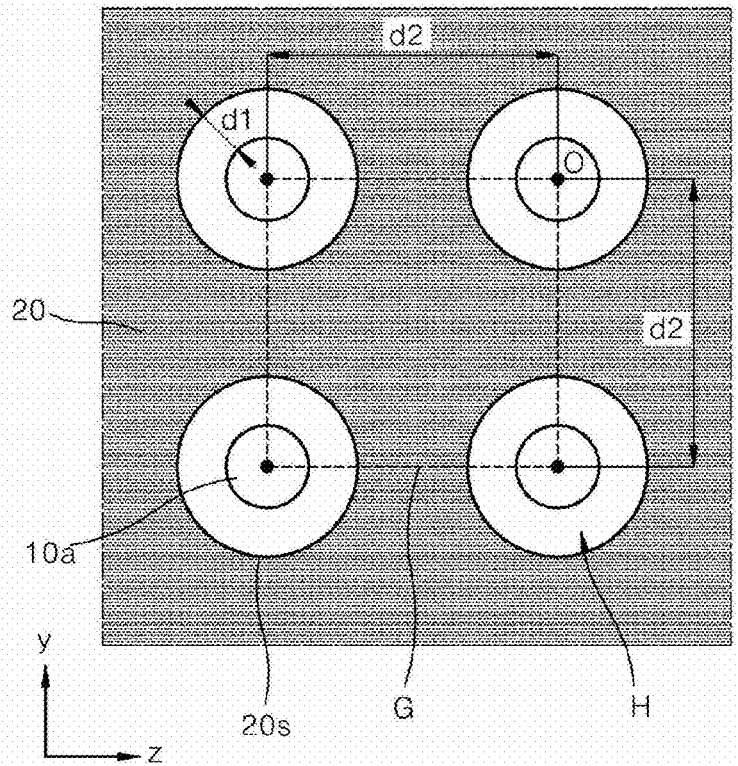
FIG. 4c is a plan view illustrating a plane of the member for a flexible device, according to the embodiments of the present invention, which is illustrated in FIG. 4a or 4b.

FIG. 4c is a plan view illustrating a plane of the member for a flexible device, according to the embodiments of the present invention, which is illustrated in FIG. 4a or 4b.

Referring to FIG. 4c, the metal electrode 20 may include a metal (e.g., copper) composed of a plurality of crystal gains G, and at least one nanoholes H may be formed between the plurality of crystal grains G. This configuration may be realized by controlling conditions of the deposition process so that the average size d2 of the crystal grains G that constitutes the deposited metal electrode 20 corresponds to the average spacing d2 between the nanoholes H adjacent to each other. Furthermore, the configuration may be realized by controlling the conditions of the deposition process so that the average diameter d2 of the crystal grains G that constitutes the deposited metal electrode 20 corresponds to the average spacing d2 between the nanopillars 10a adjacent to each other. According to the member for a flexible device that includes the crystal grains G of the above size, electrical or mechanical destruction during repetitive bending of the metal thin film may be prevented by facilitating the annihilation of dislocations. According to a modified embodiment of the present invention, the metal electrode 20 may include a metal (e.g., copper) composed of a plurality of crystal grains, and at least one crystal grain G of the plurality of crystal grains may include at least one nanohole H.

Figure 4D:
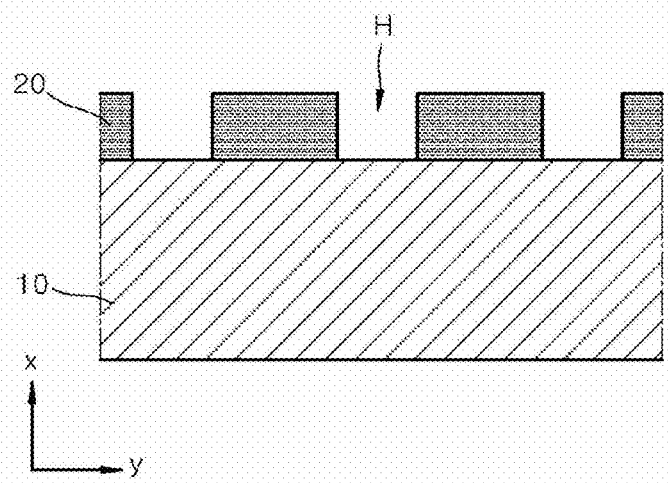
FIG. 4d is a cross-sectional view illustrating a cross section of a member for a flexible device according to another embodiment of the present invention.

FIG. 4d is a cross-sectional view illustrating a cross section of a member for a flexible device according to another embodiment of the present invention.

Referring to FIG. 4d, the member for a flexible device according to another embodiment of the present invention may include a substrate 10 and a metal electrode 20 that is disposed on the substrate 10 and includes a least one nanohole H. In the member for a flexible device according to another embodiment of the present invention, nanopillars (10a of FIGS. 4a and 4b) penetrating through the nanoholes H may not be finally configured on the substrate 10.

The structure disclosed in FIG. 4d may be realized by further performing the step of removing the nanopillars 10a from the member for a flexible device illustrated in FIG. 4a or 4b. If the nanopillar 10a and the substrate 10 are respectively formed of different materials, the nanopillars 10a may be selectively removed by using an etching process having different etch rates. If the nanopillar 10a and the substrate 10 are formed of the same material, the nanopillars 10a may be selectively removed by appropriately controlling an endpoint of the etching process of the nanopillars 10a.

Alternatively, the structure disclosed in FIG. 4d may be realized by first preparing the substrate 10 that has a flat top surface and then forming the metal electrode 20 that includes at least one nanohole H without separately forming the nanopillars (10a of FIGS. 4a and 4b) on the substrate 10. A method of forming the metal electrode 20 that includes the nanoholes H may be realized by first forming a metal thin film that does not include nanoholes H, on the substrate 10, forming nano-sized beads that has an etch selectivity with respect to the metal thin film, on a top surface of the metal thin film, and then etching the metal thin film using the beads as a mask.

In the member for a flexible device described with reference to FIG. 4d, the metal electrode 20 may also include a metal (e.g., copper) that is composed of a plurality of crystal grains as in FIG. 4c, and at least one nanohole H may be formed between the plurality of crystal grains G. This configuration may be realized by having the average size d2 of the crystal grains G that constitute the deposited metal electrode 20 correspond to the average spacing d2 between the nanoholes H adjacent to each other. The member for a flexible device including the grains G of the above described size may help facilitate the annihilation of dislocations, thereby preventing electrical or mechanical destruction during repetitive bending of the metal thin film. According to another modified embodiment of the present invention, the metal electrode 20 may include a metal (e.g., copper) that is composed of a plurality of crystal grains, and at least one crystal grain G of the plurality of crystal grains may include at least one nanohole H.

Figure 5A:
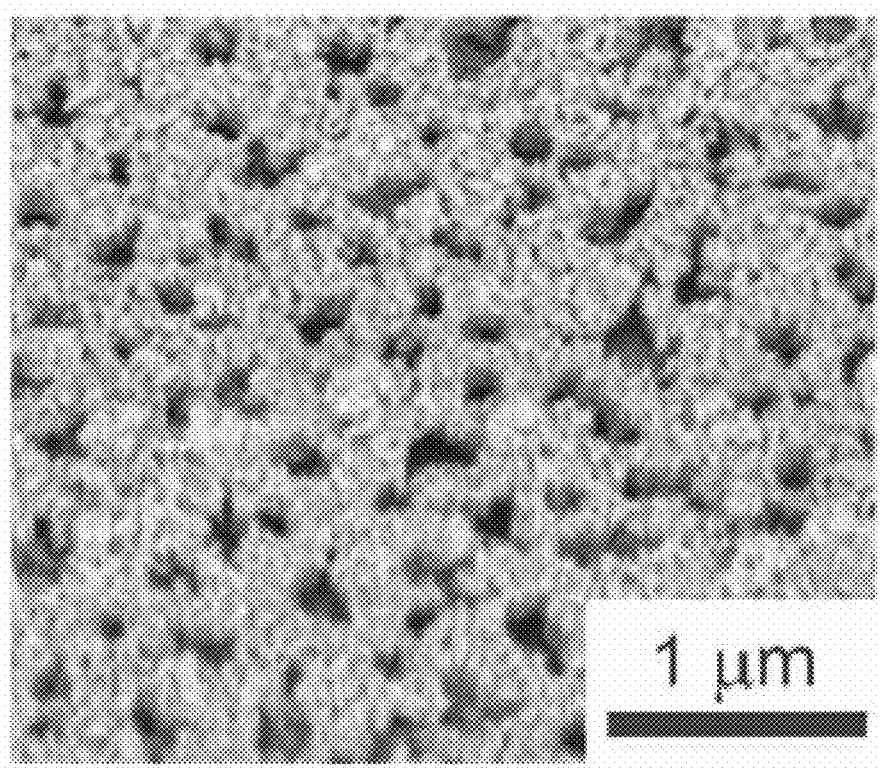
FIG. 5a is an image illustrating a copper electrode including nanoholes in which polyimide nanopillars are removed in a member for a flexible device according to an embodiment of the present invention.
Figure 5B:
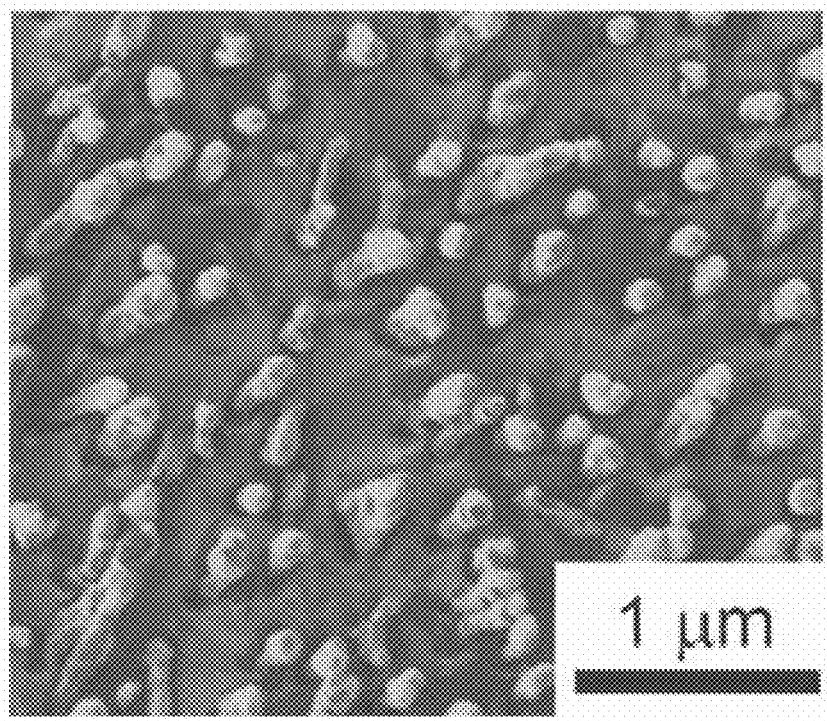
FIG. 5b is a focused ion beam (FIB) image illustrating a copper electrode including nanoholes and polyimide nanopillars in a member for a flexible device according to an embodiment of the present invention.
Figure 5C:
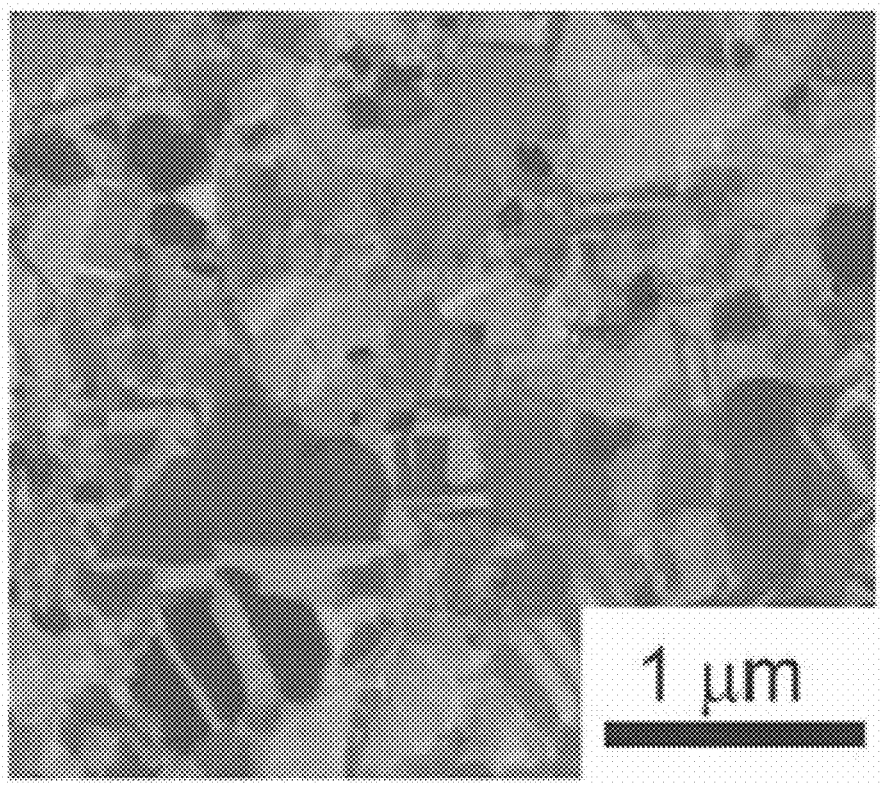
FIG. 5c is a FIB image illustrating a copper thin film typically formed on a polyimide substrate.

FIG. 5a is an image illustrating a copper electrode including nanoholes in which polyimide nanopillars are removed in a member for a flexible device according to an embodiment of the present invention, FIG. 5b is a focused ion beam (FIB) image illustrating a copper electrode including nanoholes and polyimide nanopillars in a member for a flexible device according to an embodiment of the present invention, and FIG. 5c is a FIB image illustrating a copper thin film typically formed on a polyimide substrate.

Referring to FIG. 5a, a metal electrode is realized in which the nanopillars 10a are completely removed from the member for a flexible device illustrated in FIG. 4a or 4b. Furthermore, it will be confirmed that the nanoholes are uniformly distributed within the entire metal electrode. In the member for a flexible device according to the embodiment of the present invention, the initial resistance of a copper thin film (see FIG. 5b) in the copper electrode that includes polyimide nanopillars and nanoholes was 5.78Ω, while the initial resistance of the copper thin film (see FIG. 5c) that was formed in a conventional manner on a bare polyimide substrate for comparison purposes was 4.17Ω. In the member for a flexible device according to the embodiment of the present invention, the initial resistance of the copper thin film was about 38% higher than the initial resistance of the conventional copper thin film. As described below, however, the member for a flexible device according to the embodiment of the present invention may exhibit a lower and more stable final electrical resistance after repetitive deformation. According to the FIB images in FIGS. 5b and 5c, it will be confirmed that the size of crystal grains of the copper thin film that includes a nanohole structure is similar to that of the conventional copper thin film.

Figure 6A:
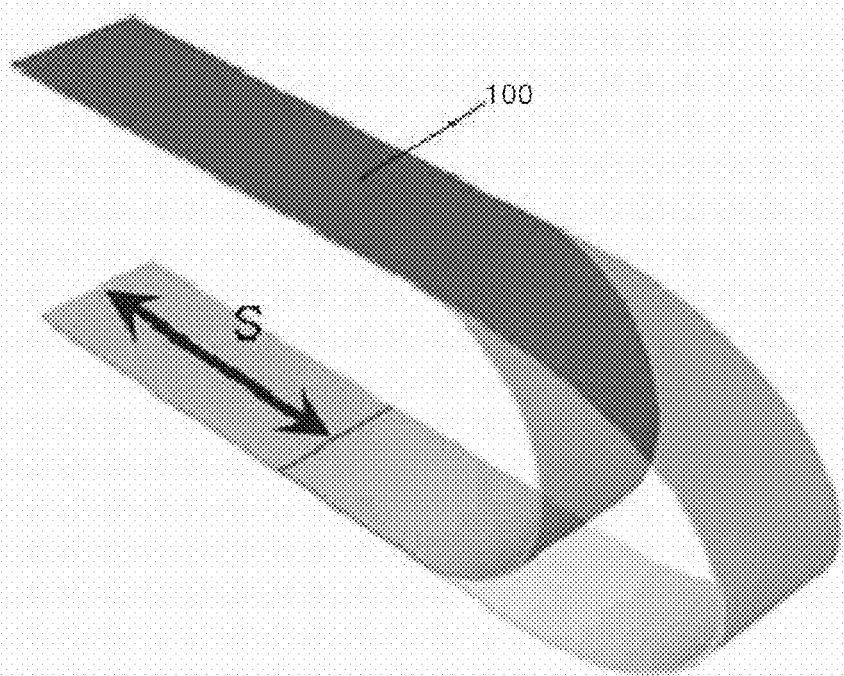
FIG. 6a illustrates a conceptual view schematically illustrating a bending fatigue test system for a member for a flexible device according to an embodiment of the present invention.
Figure 6B:
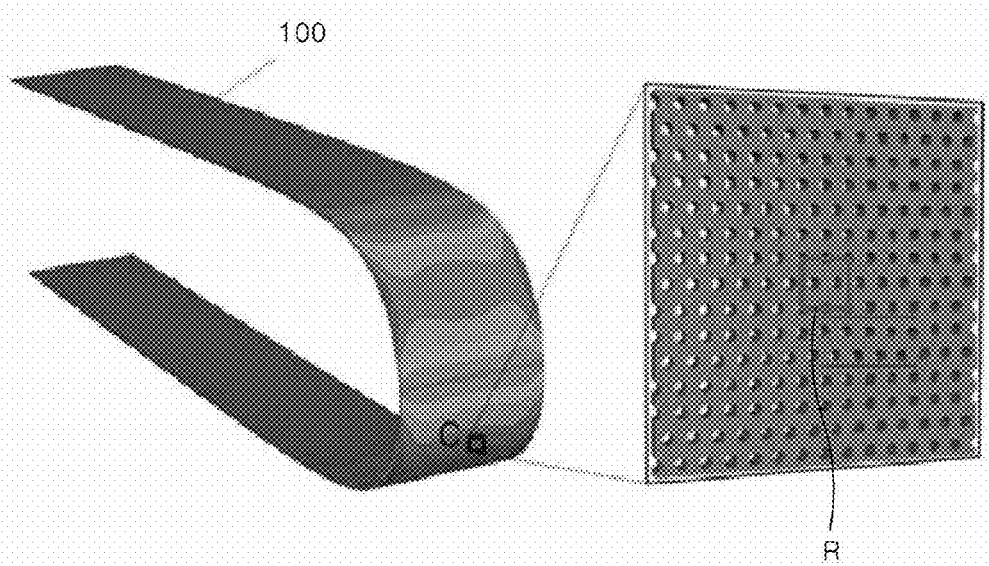

FIG. 6a illustrates a conceptual view schematically illustrating a bending fatigue test system for a member for a flexible device according to an embodiment of the present invention, and FIG. 6b is a result of a bending fatigue evaluation which is measured on the member for a flexible device according to the embodiment of the present invention using the system of FIG. 6a.

Particularly, FIG. 6a is a schematic view illustrating a bending fatigue tester used in the experimental example of the present invention, FIG. 6b illustrates the maximum strain generated in a polyimide substrate during a bending fatigue test, and zone C represents an area where a high periodicity is maintained. A structure on the right side in FIG. 6b illustrates a periodic nanohole structure of zone C and box R represents a representative volume element (RVE) of zone C.

A metal specimen 100 on a flexible substrate was cut to have lengths of 70 mm and 15 mm, and then both ends thereof were fixed between two parallel plates. A bending test was carried out as illustrated by an arrow of FIG. 6a while the upper plate was fixed and the lower plate was repeatedly moved. The gap between the two plates was 7.8 mm and this is a condition of applying 1.6% strain to a metal thin film. The repeated moving distance was 10 mm and the frequency was 5 Hz.

Changes in electrical resistance during the bending test were measured to be up to 500,000 cycles with a current and voltage meter (Agilent 34410A). Then, the specimen 100 was observed with a scanning electron microscope (FE-SEM, Hitachi S-4800). A finite element method (FEM) was used to analyze the stress state of a region around the nanoholes and its effect on crack formation and propagation. An RVE, one of computer simulation techniques, using a periodic structure among the entire structures was used. Since the bending of the entire specimen is uniform, the nanohole structure may be regarded as a structure in which a random structure is periodically repeated. However, since the strains may differ in each region as in FIG. 6b, the RVE structure may not be directly used. It is almost impossible to model the entire structure because too many nanoholes exist in the thin film. Instead, the inventors of the present invention carried out a double structure modeling (see FIG. 6b). It is possible to realize this concept because a very strong periodicity exists in a localized area. Since hundreds or thousands of unit structures exist in this area as illustrated by C in FIG. 6b, it may be assumed that the periodicity is strong enough.

Since the thickness of polyimide was 125 µm, which is far greater than the thickness of copper, i.e., 200 nm, it was assumed that the stress of the copper is affected by the substrate. In the modeling, a boundary condition may be expressed by the following equation.

$$u_B - u_A = (F - I)(X_B - X_A)$$

Here, F denotes the given deformation gradient, u denotes a representative displacement, X denotes a representative position, and I denotes an identity tensor. Subscripts A and B denote two arbitrary points in the RVE. A three-dimensional perfect plastic deformation model was used for the entire modeling. Physical properties of the materials used (copper (Cu) and polyimide (PI)) in calculation are presented in Table 1. A Young's modulus of the copper was 130 GPa and a yield strength of the copper was 1 GPa at a thickness of 200 nm in accordance with the result by Spaepen. Work hardening was not considered because plastic deformation was little.

TABLE 1

| | Elastic modulus (GPa) | Poisson's ratio, v | Yield stress (MPa) |
|---|---|---|---|
| Cu | 130.0 | 0.36 | 1,000 |
| PI | 2.34 | 0.34 | — |

Figure 7A:
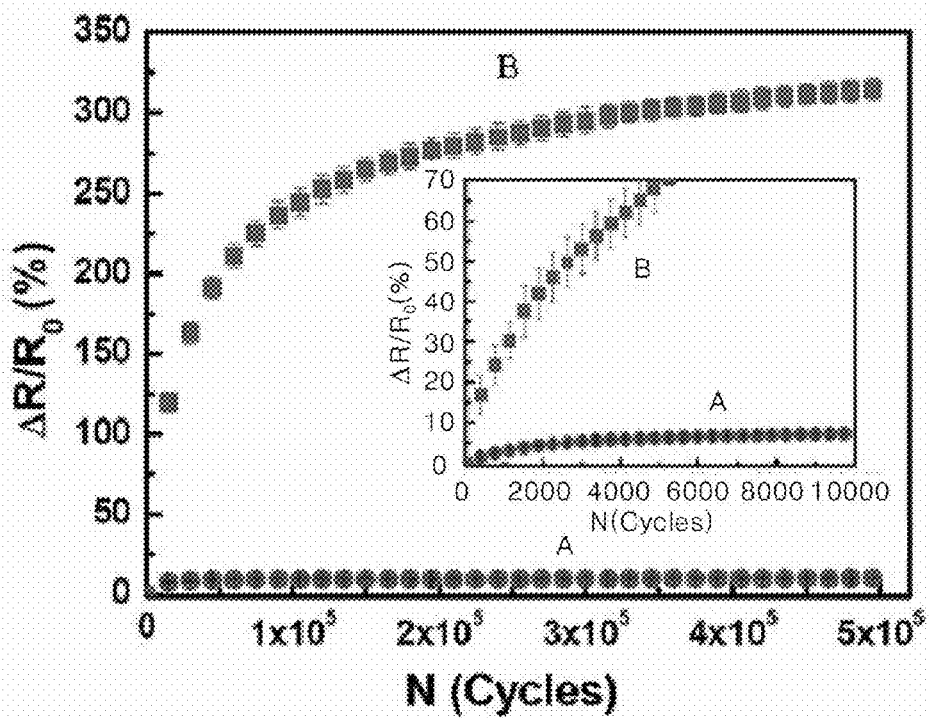
FIG. 7a is a graph illustrating results of comparing a typical copper electrode and a copper electrode including nanoholes according to an embodiment of the present invention, according to the number of bending cycles.

FIG. 7a is a graph illustrating the results of comparing a conventional copper electrode and a copper electrode including nanoholes according to an embodiment of the present invention, according to the number of bending cycles, and FIGS. 7b to 7e are images illustrating the results of comparing the conventional copper electrode and the copper electrode including nanoholes according to the embodiment of the present invention, according to the number of bending cycles.

Figure 7B:
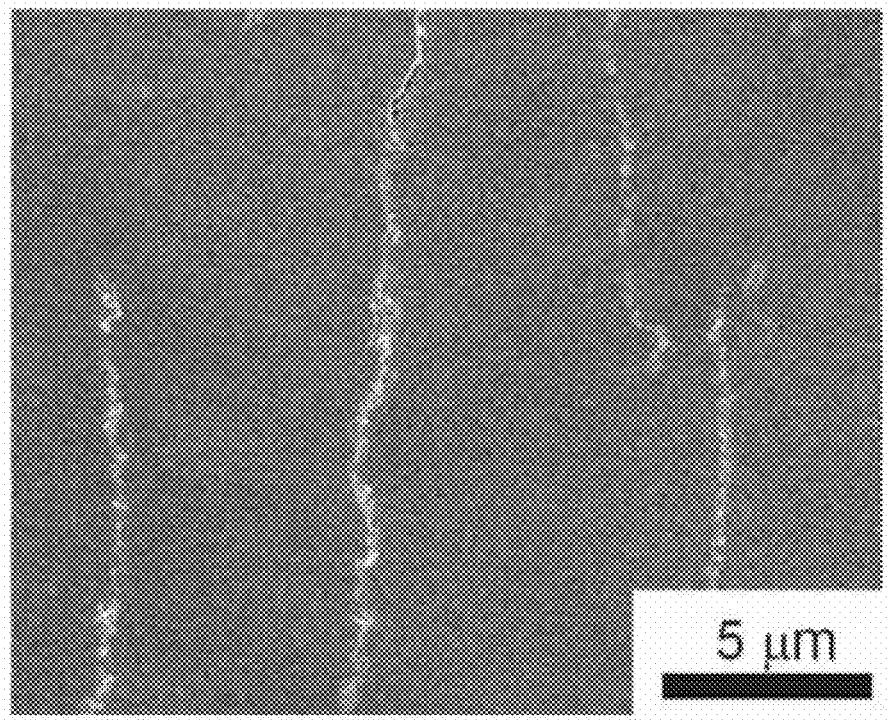
FIGS. 7b to 7e are images illustrating results of comparing the typical copper electrode and the copper electrode including nanoholes according to the embodiment of the present invention, according to the number of bending cycles.
Figure 7C:
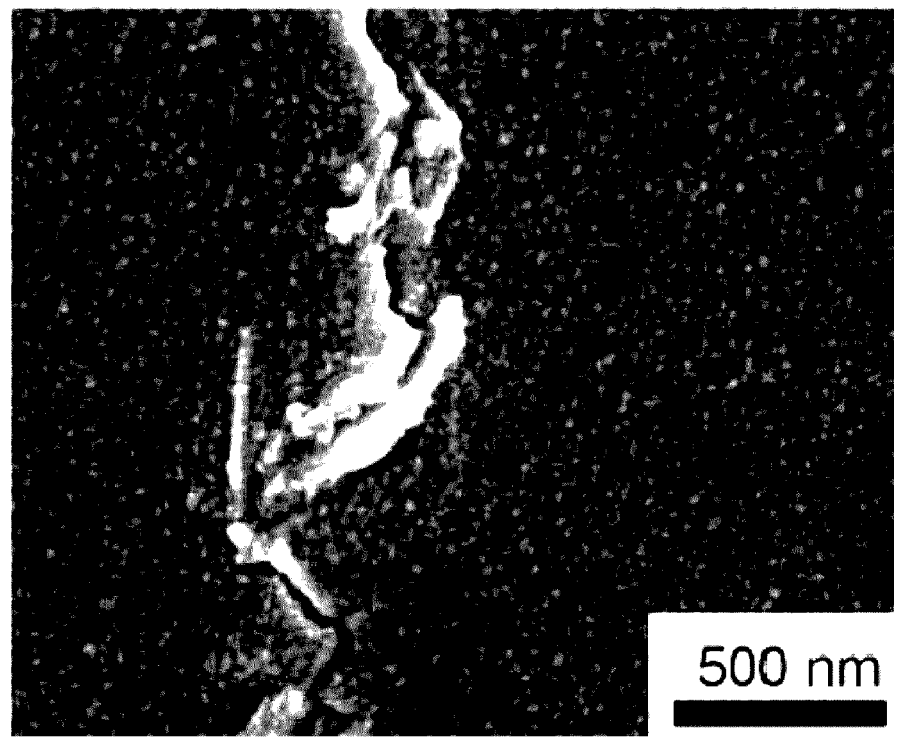
Figure 7D:
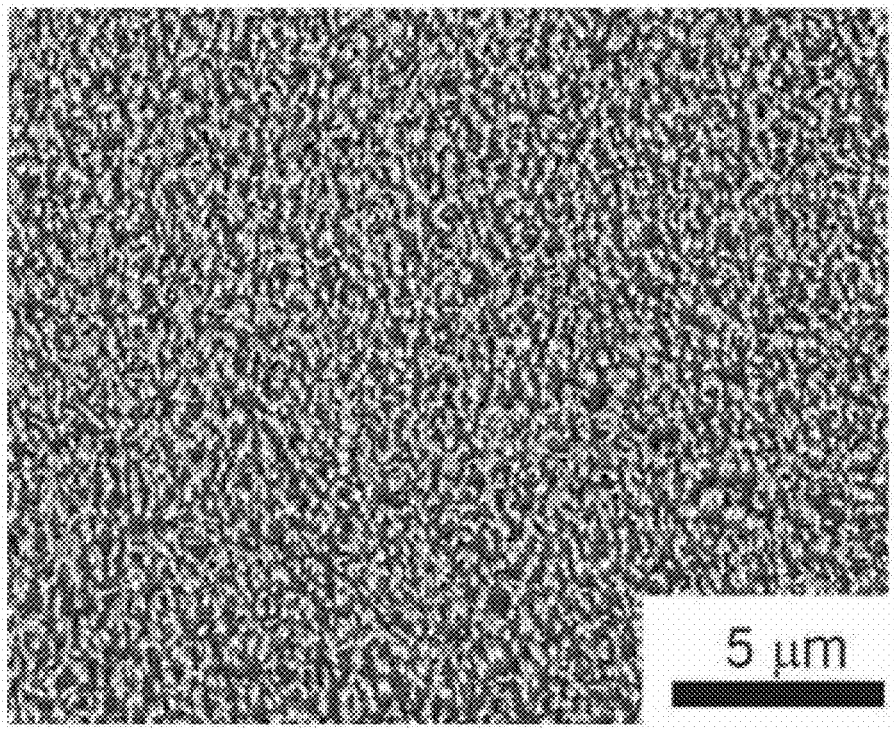
Figure 7E:
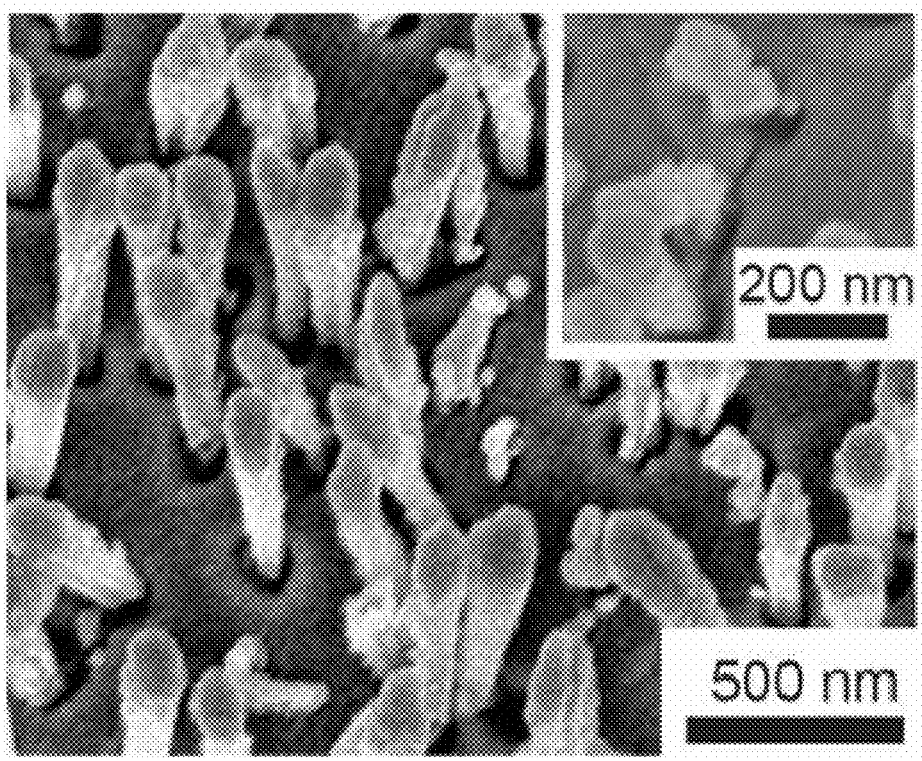

Particularly, FIG. 7a is a graph illustrating changes in electrical resistance of the copper electrode (A) that includes nanoholes and the conventional copper electrode (B) versus the number of bending cycles, FIGS. 7b and 7c are images illustrating fracture characteristics of the typical copper electrode, and FIGS. 7d and 7e are images illustrating appearances after 500,000 bending cycles of the copper electrode including nanoholes, wherein a bending direction is a horizontal direction.

FIG. 7a illustrates the changes in electrical resistance of the copper electrode (A) that includes nanoholes and the conventional copper electrode (B) versus the number of bending cycles. The electrical resistance of the conventional copper electrode increased as the bending was repeated. The electrical resistance increased by 100%% at about 10,000 cycles, and increased by 200% at about 20,000 cycles. The rate of change in electrical resistance slowed at 200,000 cycles or more, but the electrical resistance increased by 300% or more at 500,000 cycles. The final resistance after 500,000 cycles was 17.35Ω.

In contrast, the copper electrode that includes nanoholes exhibited a very small change in electrical resistance. The final resistance was 6.36Ω. The variation range of electrical resistance of the copper electrode that includes nanoholes was 10% or less. The narrow variation range was observed at an initial stage before 10,000 cycles. After 10,000 cycles, the change in electrical resistance did not occur, and the change in electrical resistance was maintained until 500,000 cycles. It is expected that the electrical resistance will not change although even more cycles are repeated. The increase in resistance due to fatigue is related to the formation and propagation of cracks. The change in electrical resistance as described above means that cracks are generated but do not propagate.

Therefore, the formation of cracks in the nanohole structure was studied by observing the microstructures and computer simulations of the metal electrode in which fatigue fractures did not occur. FIGS. 7b and 7c are SEM images of the conventional copper electrode after 500,000 bending cycles. It was observed that cracks about 100 mm long were generated perpendicular to the bending direction. Fatigue fracture occurs due to the formation and propagation of cracks, and in a thin film, the movement of dislocations during repeated deformation may form protrusions composed of extrusions and intrusions to cause a stress concentration phenomenon, and cracks may be formed. The formation of the protrusions was also observed (see FIGS. 7b and 7c). The formation of cracks occurs before 1,000 cycles and generates the change in electrical resistance, and the cracks may continue to propagate. The continuously propagated cracks may change the electrical resistance and eventually cause a change in resistance by 300% or more.

In contrast, the formation and propagation of cracks of the copper electrode that includes nanoholes differ significantly from that of the conventional copper electrode. No formation of protrusions was observed in the copper electrode that includes nanoholes, as illustrated in FIGS. 7d and 7e. The shape of the copper electrode that includes nanoholes was almost the same before and after the bending. These advantages may be interpreted in terms of the following two aspects. First, no formation of protrusions means formation of fatigue cracks due to the movement of dislocations was completely suppressed. Second, long cracks were not observed because the propagation of cracks did not occur due to a nanohole effect in which crack tips are blunted. As described above, the formation of cracks is closely related to the formation of protrusions due to the movement and pile-up of dislocations. As observed in the computer simulations, a tensile stress is applied to the copper thin film. Therefore, plastic deformation occurs in the copper thin film.

Figure 8A:
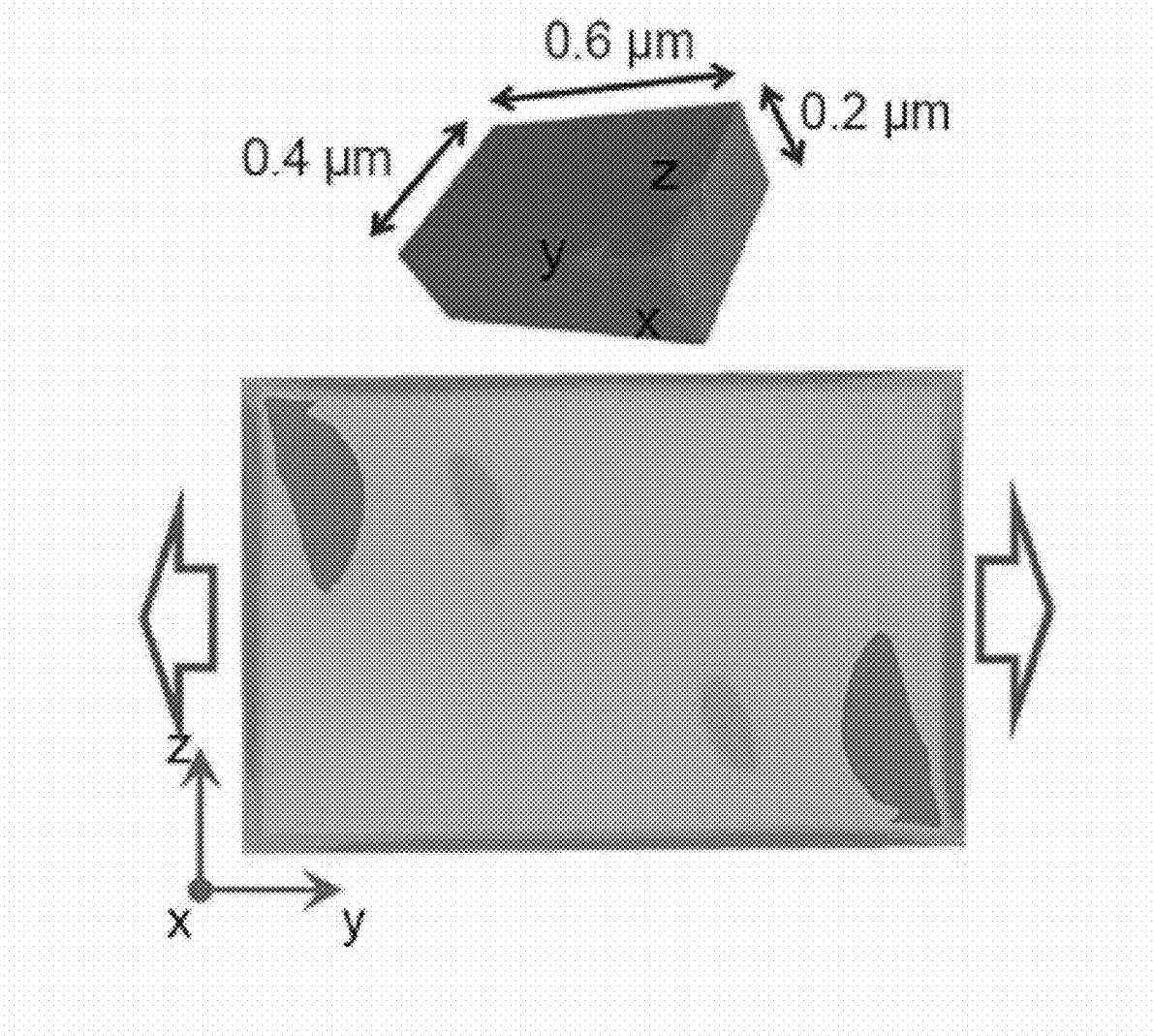
FIGS. 8a and 8e are drawings illustrating results of deformation of various copper thin films according to simulations.
Figure 8B:
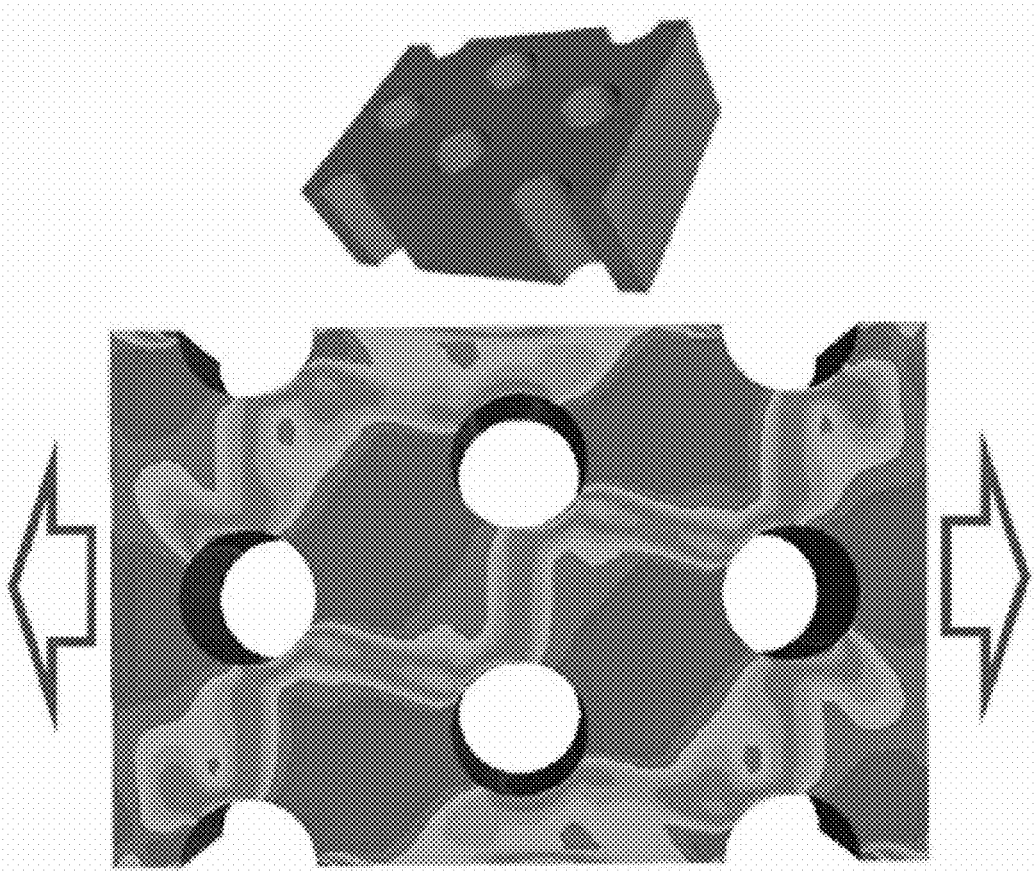
Figure 8C:
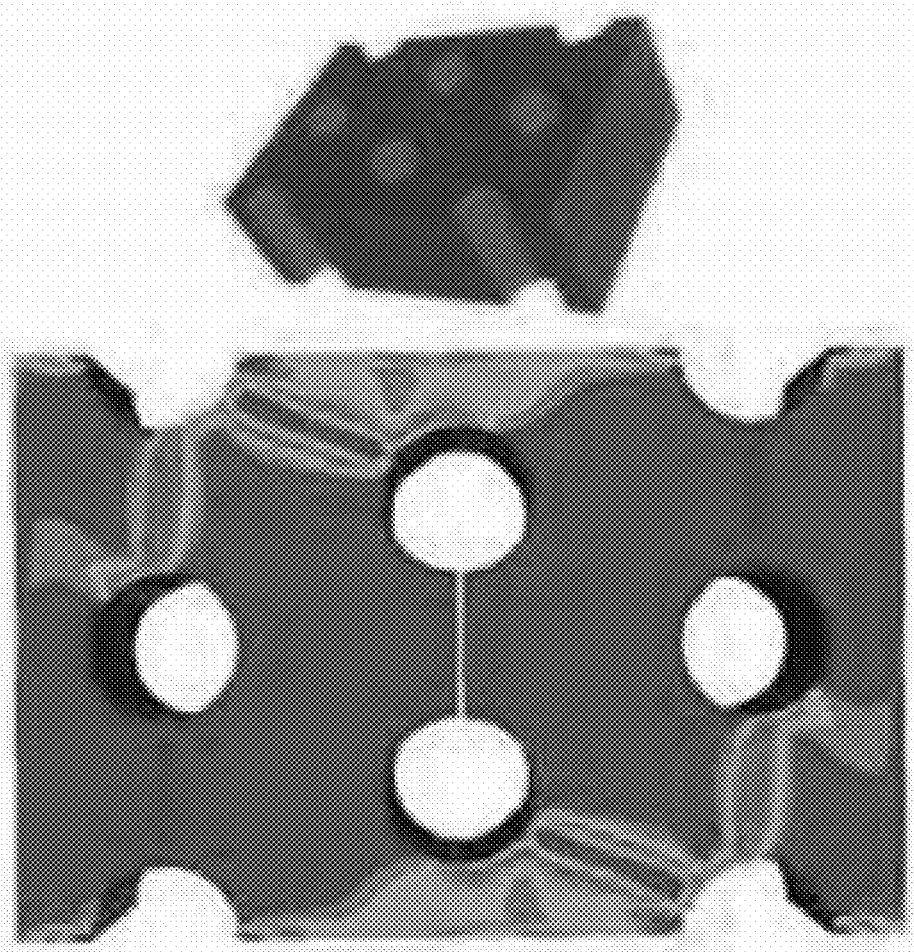
Figure 8D:
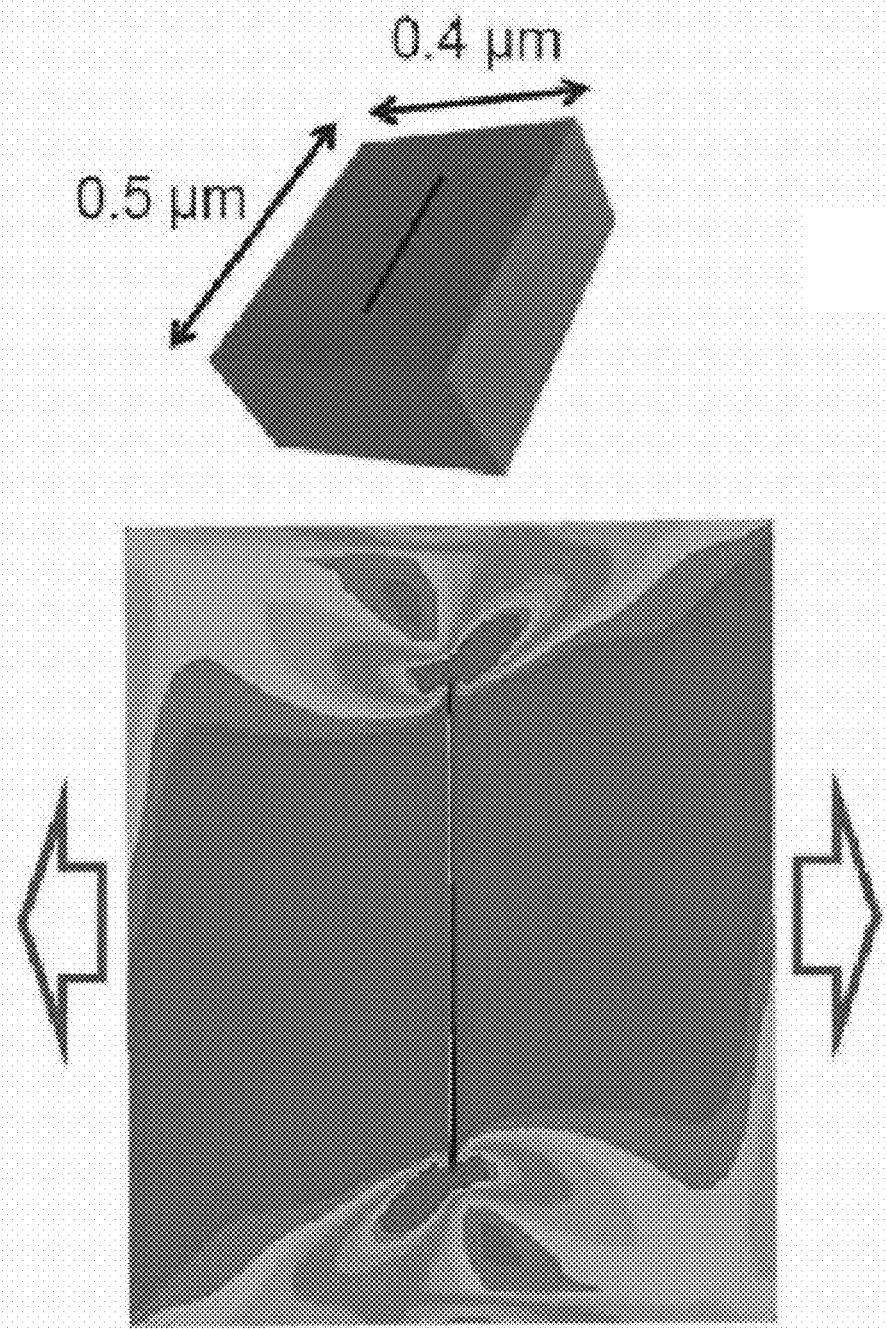
Figure 8E:
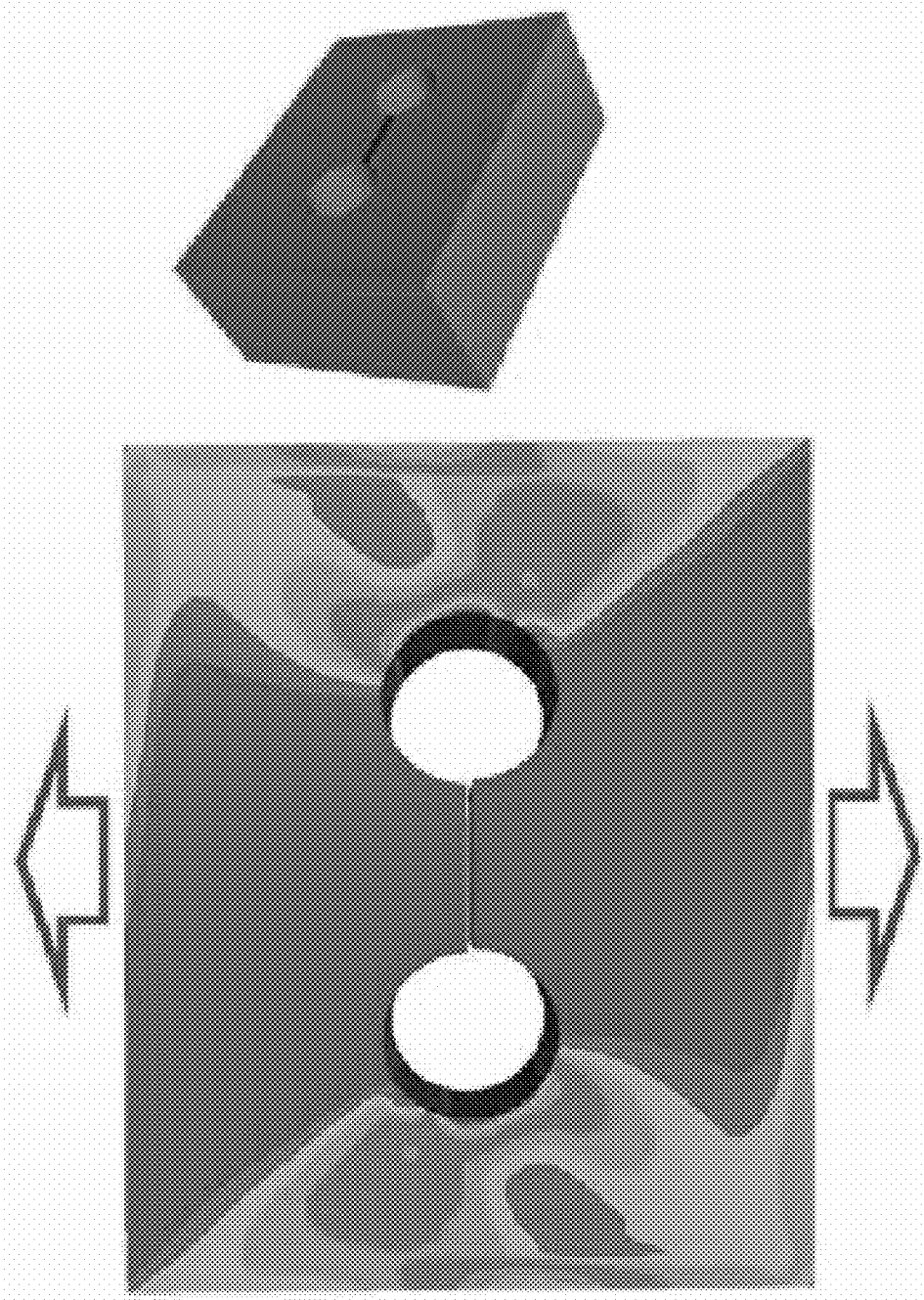

FIGS. 8a and 8e illustrate the results of deformation of various copper thin films according to simulations.

Particularly, FIGS. 8a, 8b, 8c, 8d, and 8e respectively illustrate equivalent plastic strains according to computer simulations of a conventional copper thin film, a nanohole-structured copper thin film, a nanohole-structured copper thin film having cracks formed therein, a conventional thin film having cracks formed therein, and a nanohole thin film having cracks formed therein.

Dislocations move along slip planes during tensile deformation, are annihilated at a surface and cause the formation of protrusions. Same strain distributions cause the formation of protrusions on the surface with the same probability. In contrast, in the nanohole structure, plastic deformation may occur intensively on the surface near nanoholes. Since the plastic deformation is concentrated, cracks should be formed in one area. In the actual results, however, protrusions were not observed. Instead, short cracks without protrusions were observed as in FIG. 8e. This phenomenon may be explained by the fact that the nanoholes acted as annihilation sites of dislocations. The size of a typical crystal grain is similar to the distance between the nanoholes. Therefore, a single crystal grain may include a lot of nanoholes. The surface area of the copper thin film increases due to the nanoholes, and as a result, dislocations do not pile up along the slip planes, but are annihilated at the surface of the three-dimensional nanohole structure.

Furthermore, since the formation of the short cracks may provide some margins, deformability may be further improved. According to the results of the computer simulations, cracks may decrease total strain, and this may be due to the fact that the cracks generated earlier may stop the subsequent formation of cracks (see FIGS. 8b and 8c, and Table 2). Table 2 presents calculated average and maximum equivalent plastic strains of each finite element (FE) model according to the computer simulations.

TABLE 2

| | Avg. equivalent plastic strain | Max. equivalent plastic strain |
|---|---|---|
| Conventional copper thin film (FIG. 8a) | 0.052 | 0.11 |
| Nanohole-structured copper thin film (FIG. 8b) | 0.041 | 0.46 |
| Nanohole-structured thin film having cracks formed therein (FIG. 8c) | 0.021 | 0.46 |
| Conventional thin film having cracks formed therein (FIG. 8d) | 0.028 | 0.77 |
| Nanohole thin film having cracks formed therein (FIG. 8e) | 0.032 | 0.36 |

Regarding the propagation of cracks, a few short cracks (<1 μm) were observed near the nanoholes. The electrical resistance increased by about 10% due to the short cracks as illustrated in FIG. 7e. However, these short cracks did not propagate to cause long cracks, as illustrated in FIG. 7a which shows fracture characteristics of a conventional electrode. This is related to the propagation of cracks, particularly to the effect of blunting crack tips. As illustrated in the computer simulation of FIG. 8d, when cracks occur in some area of the conventional copper thin film, the crack tips are very sharp in a propagation step. Since there is no obstacle in the propagation step, cracks may continue to propagate. However, since nanoholes may blunt crack tips, the nanoholes may become obstacles blocking the propagation of cracks (see FIG. 8e). According to the results of the computer simulations (see FIGS. 8d and 8e), it expected that cracks having blunt tips will propagate less.

In conclusion, the metal electrode that includes nanoholes significantly increased resistance to fatigue facture during bending. The conventional electrode exhibited a change in electrical resistance by 300% or more, while the metal electrode having nanoholes exhibited a change in electrical resistance by 10% or less even after 500,000 bending cycles. This structure may help to improve the long-term reliability of a flexible device. The reasons for the improvement of fatigue fracture resistance may be explained as follows:

First, the nanohole structure may induce plastic deformation in a localized area (a); to suppress the formation of protrusions by the annihilation of dislocations near the nanoholes (b); and ensure deformability due to the formation of cracks (c). Second, since the nanohole electrode may blunt crack tips, the nanohole electrode may prevent the propagation of cracks by relieving stress concentration. Therefore, fatigue fracture occurred in the conventional electrode was not observed in the metal electrode including a nanohole structure. It is expected that these results may be used for developing a metal electrode for fabricating a highly reliable flexible device.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A member for a flexible device, the member comprising:
   a substrate;
   a plurality of nanopillars formed on the substrate; and
   a metal electrode which is formed on the substrate and includes a plurality of nanoholes, and the nanopillars penetrate through the nanoholes, wherein the substrate and the nanopillars include polyimide, and the metal electrode includes copper.

2. The member of claim 1, wherein the nanopillars are formed integrally with the substrate and extend upward from a top surface of the substrate.

3. The member of claim 1, wherein the metal electrode is plate-shaped and is formed on a top surface of the substrate.

4. The member of claim 1, wherein the nanopillars are spaced apart from sidewalls of the nanoholes.

5. The member of claim 1, wherein each nanopillar of the plurality of nanopillars penetrates through each nanohole of the plurality of nanoholes.

6. The member of claim 1, wherein the metal electrode comprises a plurality of crystal grains, and
at least one crystal grain of the plurality of crystal grains comprises nanoholes.

7. The member of claim 1, wherein the metal electrode comprises a plurality of crystal grains, and
the nanoholes are formed between the plurality of crystal grains.

8. The member of 1, wherein the metal electrode comprises a plurality of crystal grains, and
an average size of the crystal grains corresponds to an average spacing between nanoholes which are adjacent to each other.

9. The member of claim 1, wherein the metal electrode comprises a plurality of crystal grains, and
an average size of the crystal gains corresponds to an average spacing between nanopillars which are adjacent to each other.

10. The member of claim 1, wherein an average thickness and an average height of the nanopillars and an average spacing between nanopillars adjacent to each other are between ten to a hundred nanometers.

11. A method of manufacturing a member for a flexible device, the method comprising:
providing a substrate on which a plurality of nanopillars are formed;
forming a metal electrode on the substrate in which the metal electrode includes a plurality of nanoholes through which the nanopillars penetrate; and
removing a portion of the nanopillars protruding from a top surface of the metal electrode, after forming the metal electrode on the substrate.

12. The method of claim 11, wherein the providing the substrate on which the plurality of nanopillars are formed comprises:
preparing the substrate having a flat top surface; and
forming the nanopillars by etching a portion of an upper part of the substrate having the flat top surface.

13. The method of claim 11, wherein forming the metal electrode on the substrate, comprises depositing a metal on the substrate by a thermal evaporation process.

14. The method of claim 13, wherein the thermal evaporation process is carried out under a condition in which overhangs of the metal can be formed at upper ends of the nanopillars.

15. The method of claim 11, wherein the providing the substrate on which the plurality of nanopillars are formed comprises:
preparing the substrate having a flat top surface; and
growing the nanopillars on the substrate having the flat top surface.

* * * * *